United States Patent
Vrtis et al.

(10) Patent No.: US 9,549,463 B1
(45) Date of Patent: Jan. 17, 2017

(54) RIGID TO FLEXIBLE PC TRANSITION

(71) Applicant: Multek Technologies, Ltd, San Jose, CA (US)

(72) Inventors: Joan K. Vrtis, Mesa, AZ (US); Michael James Glickman, Mountain View, CA (US); Mark Bergman, Redwood City, CA (US); Shurui Shang, San Jose, CA (US)

(73) Assignee: Multek Technologies, Ltd., San Jose, CA (US)

( * ) Notice: Subject to any disclaimer, the term of this patent is extended or adjusted under 35 U.S.C. 154(b) by 0 days.

(21) Appl. No.: 14/712,823

(22) Filed: May 14, 2015

Related U.S. Application Data

(60) Provisional application No. 61/994,759, filed on May 16, 2014.

(51) Int. Cl.
  *H05K 1/00* (2006.01)
  *H05K 1/02* (2006.01)
  *H05K 3/24* (2006.01)

(52) U.S. Cl.
  CPC .............. *H05K 1/0281* (2013.01); *H05K 3/24* (2013.01)

(58) Field of Classification Search
  CPC ...... H05K 1/148; H05K 1/147; H05K 1/0281; H05K 1/028; H05K 1/0278; H05K 3/4691; H05K 3/4652
  See application file for complete search history.

(56) References Cited

U.S. PATENT DOCUMENTS

| | | | |
|---|---|---|---|
| 2,911,605 A | 11/1959 | Wales, Jr. | |
| 4,051,425 A | 9/1977 | Smith | |
| 4,255,613 A * | 3/1981 | Ketchpel | H05K 3/361 174/117 FF |
| 4,495,546 A | 1/1985 | Nakamura et al. | |
| 4,712,160 A | 12/1987 | Sato et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |
| 4,975,821 A | 12/1990 | Lethellier | |
| 5,101,322 A | 3/1992 | Ghaem et al. | |
| 5,144,742 A | 9/1992 | Lucas | |
| 5,164,657 A | 11/1992 | Gulczynski | |
| 5,204,806 A | 4/1993 | Sesaki et al. | |
| 5,235,491 A | 8/1993 | Weiss | |
| 5,262,594 A | 11/1993 | Edwin | |
| 5,262,932 A | 11/1993 | Stanley et al. | |
| 5,295,044 A | 3/1994 | Araki et al. | |
| 5,398,128 A | 3/1995 | Tajima | |
| 5,490,052 A | 2/1996 | Yoshida et al. | |
| 5,499,444 A | 3/1996 | Doane, Jr. | |
| 5,552,776 A | 9/1996 | Wade | |

(Continued)

*Primary Examiner* — Steven T Sawyer
(74) *Attorney, Agent, or Firm* — Haverstock & Owens LLP

(57) ABSTRACT

A circuit board comprises one or more rigid sections, one or more flexible sections, and one or more transition areas where the circuit board transitions from the rigid section to the flexible section. One or more mechanically restrictive components are applied at a transition area to prevent failure and/or breakage of the circuit as it is bent and flexed. The mechanically restrictive components can be dispersed throughout the circuit as a coverlay, an underlay, and symmetrically positioned within the circuit board as an overlay and an underlay.

18 Claims, 3 Drawing Sheets

(56) References Cited

U.S. PATENT DOCUMENTS

| | | | |
|---|---|---|---|
| 5,565,761 A | 10/1996 | Hwang | |
| 5,565,781 A | 10/1996 | Dauge | |
| 5,592,128 A | 1/1997 | Hwang | |
| 5,712,772 A | 1/1998 | Telefus et al. | |
| 5,742,151 A | 4/1998 | Hwang | |
| 5,747,977 A | 5/1998 | Hwang | |
| 5,798,635 A | 8/1998 | Hwang et al. | |
| 5,804,950 A | 9/1998 | Hwang et al. | |
| 5,811,895 A | 9/1998 | Suzuki et al. | |
| 5,818,207 A | 10/1998 | Hwang | |
| 5,870,294 A | 2/1999 | Cyr | |
| 5,894,243 A | 4/1999 | Hwang | |
| 5,903,138 A | 5/1999 | Hwang et al. | |
| 5,905,369 A | 5/1999 | Ishii et al. | |
| 5,923,543 A | 7/1999 | Choi | |
| 5,997,983 A | 12/1999 | Caron | |
| 6,031,730 A | 2/2000 | Kroske | |
| 6,039,600 A | 3/2000 | Etters et al. | |
| 6,058,026 A | 5/2000 | Rozman | |
| 6,069,803 A | 5/2000 | Cross | |
| 6,077,124 A | 6/2000 | Etters et al. | |
| 6,160,725 A | 12/2000 | Jansen | |
| 6,272,015 B1 | 8/2001 | Mangtani | |
| 6,282,092 B1 | 8/2001 | Okamoto et al. | |
| 6,288,343 B1 | 9/2001 | Ahn | |
| 6,344,980 B1 | 2/2002 | Hwang et al. | |
| 6,358,064 B2 | 3/2002 | Szalay et al. | |
| 6,396,277 B1 | 5/2002 | Fong et al. | |
| 6,407,514 B1 | 6/2002 | Glaser et al. | |
| 6,469,914 B1 | 10/2002 | Hwang et al. | |
| 6,469,980 B1 | 10/2002 | Takemura et al. | |
| 6,483,037 B1 * | 11/2002 | Moore | H05K 1/0278 |
| | | | 174/254 |
| 6,483,281 B2 | 11/2002 | Hwang | |
| 6,531,854 B2 | 3/2003 | Hwang | |
| 6,541,944 B2 | 4/2003 | Hwang | |
| 6,578,253 B1 | 6/2003 | Herbert | |
| 6,605,930 B2 | 8/2003 | Hwang | |
| 6,657,417 B1 | 12/2003 | Hwang | |
| 6,671,189 B2 | 12/2003 | Jansen et al. | |
| 6,674,272 B2 | 1/2004 | Hwang | |
| 6,711,024 B1 * | 3/2004 | Johansson | H05K 1/189 |
| | | | 361/760 |
| 6,882,870 B2 | 4/2005 | Kivela | |
| 6,958,920 B2 | 10/2005 | Mednik et al. | |
| 7,047,059 B2 | 5/2006 | Avrin et al. | |
| 7,286,376 B2 | 10/2007 | Yang | |
| 7,439,962 B2 | 10/2008 | Reynolds et al. | |
| 7,998,065 B2 | 8/2011 | Avni | |
| 8,188,372 B2 | 5/2012 | Sato | |
| 9,078,115 B2 | 7/2015 | Shumunis | |
| 2002/0011823 A1 | 1/2002 | Lee | |
| 2003/0035303 A1 | 2/2003 | Balakrishnan et al. | |
| 2004/0192082 A1 | 9/2004 | Wagner | |
| 2004/0228153 A1 | 11/2004 | Cao et al. | |
| 2005/0105224 A1 | 5/2005 | Nishi | |
| 2005/0281425 A1 | 12/2005 | Greuet et al. | |
| 2006/0120059 A1 | 6/2006 | Farkas | |
| 2006/0156542 A1 * | 7/2006 | Matsuda | H05K 3/4691 |
| | | | 29/846 |
| 2007/0004450 A1 | 1/2007 | Parikh | |
| 2007/0090894 A1 * | 4/2007 | Phan | H05K 1/148 |
| | | | 333/33 |
| 2008/0047135 A1 * | 2/2008 | Arnold | H05K 3/4691 |
| | | | 29/829 |
| 2008/0289859 A1 | 11/2008 | Mikado | |
| 2009/0317639 A1 | 12/2009 | Axisa | |
| 2010/0012362 A1 * | 1/2010 | Abe | C08G 59/4042 |
| | | | 174/259 |
| 2011/0120754 A1 | 5/2011 | Kondo | |
| 2013/0213695 A1 * | 8/2013 | Lee | H05K 1/0278 |
| | | | 174/254 |
| 2014/0034366 A1 * | 2/2014 | Otsubo | H05K 3/4691 |
| | | | 174/254 |
| 2015/0029652 A1 | 1/2015 | Min | |

\* cited by examiner

Side View

Top View

RIGID TO FLEXIBLE PC TRANSITION

RELATED APPLICATIONS

This Patent Application claims priority under 35 U.S.C. 119(e) of the U.S. provisional patent application, Application No. 61/994,759, filed on May 16, 2014, and entitled "RIGID TO FLEXIBLE PC TRANSITION," which is also hereby incorporated by reference in its entirety.

FIELD OF THE INVENTION

The present invention is generally directed to wearable electronics. More specifically, the present invention is directed to a means for limiting stress in and strengthening deformable electronics.

BACKGROUND OF THE INVENTION

Electronic devices are increasingly being developed so as to be worn by a user, such as in wearable electronics. As these wearable electronics gain traction in the workplace, a new breed of devices that are able to bend, flex and stretch must be developed. These mechanical requirements present reliability challenges on mechanical components, circuit boards and other interconnects, as well as electronic components. For dynamic applications, especially where the desired amount of stretch or strain is unknown, it is important to strengthen the printed circuit board so that it is able to bend and twist without failing. Particularly, twisting and bending of a flexible circuit board can create points of failure between rigid and flexible sections. In order to limit the stress and strain to the components while still maintaining flexibility, the circuit may be strengthened through mechanical and/or other means so that it is still able to stretch and move, but not fail.

SUMMARY OF THE INVENTION

A mechanically restrictive component is applied to one or more transition areas of a circuit board in order to strengthen the areas in which the circuit board is susceptible to mechanical, and/or electrical failure as the circuit board moves and flexes. A circuit board comprises one or more rigid sections, one or more flexible sections, and one or more transition areas where the circuit board transitions from the rigid section to the flexible section. One or more mechanically restrictive components are applied to a transition area to prevent failure and/or breakage of the circuit as it is bent and flexed. The mechanically restrictive components can be dispersed throughout the circuit as a coverlay, an underlay, and symmetrically positioned within the circuit board as an overlay and an underlay. For example, the mechanically restrictive components can comprise on or more polymer based film layers attached to a top and a bottom and on an inside and an outside of one or more layers of the circuit.

In one aspect, a circuit board comprises one or more rigid sections, one or more flexible sections coupled to the one or more rigid sections, one or more transition areas where the circuit board transitions from the rigid section to the flexible section and one or more mechanical restrictive components applied to the one or more transition areas. In some embodiments, the one or more flexible sections comprise a flexible circuit board. In further embodiments, the one or more flexible sections comprise a stretchable circuit board. The mechanical restrictive component can comprise a film. In some of these embodiments, the film comprise a thickness between 0.01 mils and 20 mils. In some embodiments, the circuit board comprises one or more glass woven sections. In some embodiments, the mechanical restrictive component is continuous across the one or more transition areas. In further embodiments, the mechanical restrictive component is symmetrically positioned within the circuit board as an overlay and an underlay. Alternatively the mechanical restrictive component is positioned within the circuit board as an overlay. In some embodiments, the mechanical restrictive component is positioned within the circuit board as an underlay. Particularly, the mechanical restrictive component can fill a z-axis gap of the circuit board. For example, in some embodiments, the mechanical restrictive component fills a transition topology of the flexible circuit board in an area of the one or more transition zones.

In another aspect, a method of strengthening a circuit board comprises forming a mechanical restrictive component and applying the mechanical restrictive component to a transition area of the circuit board where the circuit board transitions from the rigid section to a flexible section. In some embodiments, the mechanical restrictive component comprise a film. In some embodiments, the circuit board comprises one or more glass woven sections. In some embodiments, the mechanical restrictive component is continuous across the one or more transition areas. In further embodiments, the mechanical restrictive component is symmetrically positioned within the circuit board as an overlay and an underlay. Alternatively the mechanical restrictive component is positioned within the circuit board as an overlay. In some embodiments, the mechanical restrictive component is positioned within the circuit board as an underlay. Particularly, the mechanical restrictive component can fill a z-axis gap of the circuit board. For example, in some embodiments, the mechanical restrictive component fills a transition topology of the flexible circuit board in an area of the one or more transition zones.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the invention are directed to a printed circuit board comprising one or more rigid component sections and one or more flexible sections connected to the one or more rigid component sections through a transition area. The printed circuit board can be configured having a multi-layer body, one or more layers of which comprise a rigid component section and one or more layers of which comprise a flexible section. The rigid component sections and flexible sections can be configured in the same vertical stack, such as to form overlapping portions. Examples of such multi-layer bodies can be found in the co-pending U.S. Provisional Patent Application Ser. No. 61/916,722, filed on Dec. 17, 2013, and entitled "NANO-COPPER VIA FILL FOR THERMAL PLATED THROUGH HOLE APPLICATIONS," which is hereby incorporated in its entirety by reference.

Reference will now be made in detail to implementations of mechanical measures for strengthening a flexible circuit board as illustrated in the accompanying drawings. The same reference indicators will be used throughout the drawings and the following detailed description to refer to the same or like parts. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
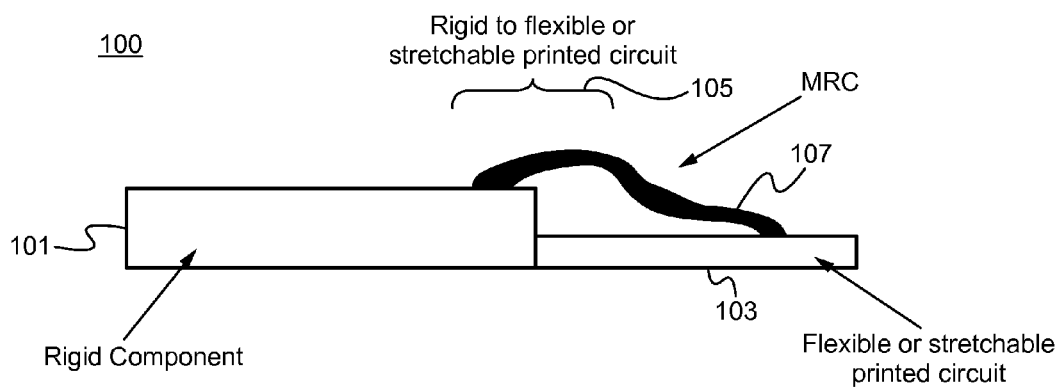
FIG. 1 illustrates a side view of a circuit board in accordance with some embodiments.

Referring now to FIG. 1, a circuit board is depicted therein. The circuit board 100 comprises a flexible and/or deformable electronic. As shown in FIG. 1, the circuit board 100 comprises one or more rigid sections 101, one or more flexible sections 103 coupled to the rigid sections 101 and one or more transition areas in the area where the circuit board 100 transitions from the one or more rigid sections 101 to the one or more flexible sections 103. In some embodiments, the one or more flexible sections 103 comprise a flexible and/or a stretchable section.

Interconnects can be formed between the one or more rigid component sections 101 and the one or more flexible sections 103. In some embodiments, the interconnects are electrical interconnects, such as conductive traces. In other embodiments, the interconnects are optical interconnects, such as waveguides. It is understood that other types of interconnects are contemplated.

A mechanically restrictive component 107 is applied to the printed circuit board 100 at a transition area 105 in order to ensure that the printed circuit board 100, and in particular interconnects within or proximate the transition area 105, are able to bend, but not break, thereby reducing the possibility of interconnect failure. The width and length of the mechanically restrictive component 107 is appropriately designed based upon the characteristics of the circuit 100. In some embodiments, the mechanically restrictive component 107 is continuously applied across the one or more transition areas 105. In some embodiments, the mechanically restrictive component 107 comprises a film. For example, in some embodiments, the mechanically restrictive component 107 comprises a film with a thickness approximately between 0.01 mils and 20 mils.

In some embodiments, the circuit board 100 is able to comprise one or more additional mechanical strengtheners 107, such as woven glass material. Multiple mechanically restrictive components 107 can be applied, each being the same type or a different type, for example film of woven glass material impregnated with an adhesive material. Each mechanically restrictive component 107 can be applied to any layer of the printed circuit board 100 as an overlay or underlay. In some embodiments, the one or more mechanically restrictive components 107 are symmetrically positioned as an overlay and an underlay. FIG. 1 shows an example of the mechanically restrictive component 107 applied as an overlay. Particularly, the mechanical restrictive component fills a z-axis gap if it exists between the one or more rigid sections 101 to the one or more flexible and/or stretchable sections 103 of the circuit board. For example, in some embodiments, the mechanical restrictive component 107 fills a transition topology of the flexible circuit board in an area of the one or more transition zones.

Figure 2:
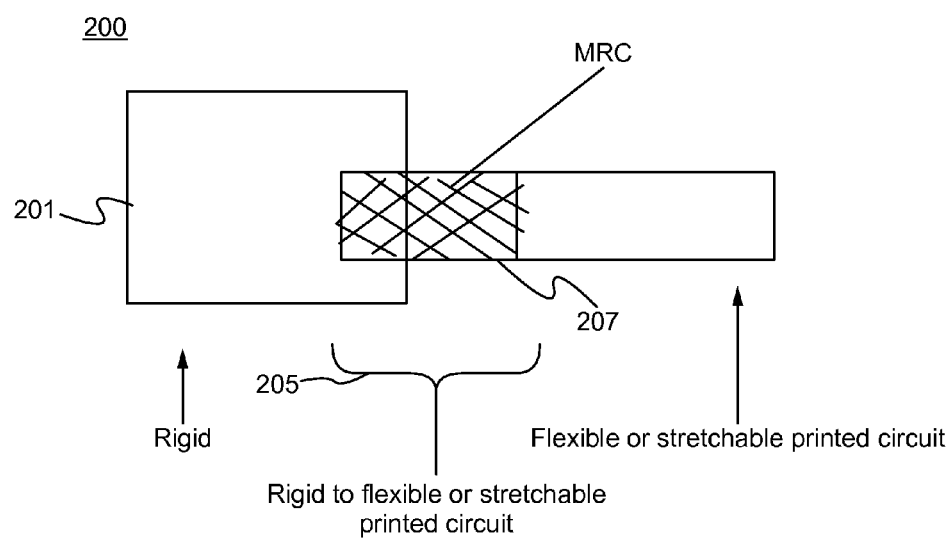
FIG. 2 illustrates a top view of a circuit board in accordance with some embodiments.

FIG. 2 illustrates a top view of a circuit board in accordance to some embodiments. The circuit board 200 is similar to the circuit board 100 as described above. The circuit board 200 comprises one or more rigid sections 201, one or more flexible sections 203 coupled to the rigid sections 201 and one or more transition areas in the area where the circuit board 200 transitions from the one or more rigid sections 201 to the one or more flexible sections 203. In some embodiments, the one or more flexible sections 203 comprise a flexible and/or a stretchable section. FIG. 2 shows a top view of the mechanically restrictive component 207 applied as an overlay.

As described above, the circuit board 200 is able to comprise one or more additional mechanical strengtheners 207, such as woven glass material. Multiple mechanically restrictive components 207 can be applied, each being the same type or a different type, for example film of woven glass material impregnated with an adhesive material.

Figure 3:
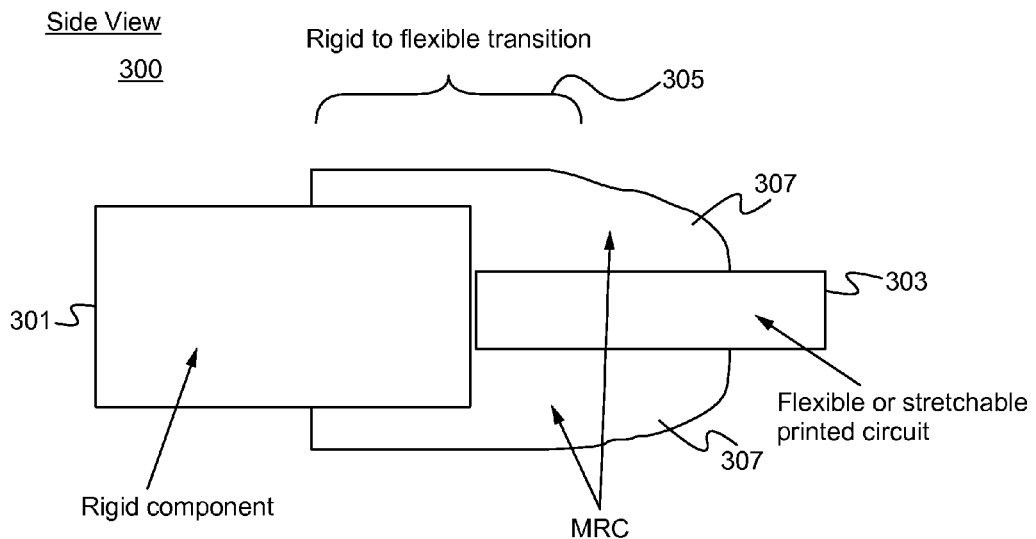
FIG. 3 illustrates a side view of a circuit board in accordance with some embodiments.

FIG. 3 illustrates a side view of a circuit board in accordance to some embodiments. FIG. 3 shows mechanically restrictive components 307 symmetrically applied to the printed circuit board 300 as an overlay and an underlay. The circuit board 300 is similar to the circuit board 100 as described above. The circuit board 300 comprises one or more rigid sections 301, one or more flexible sections 303 coupled to the rigid sections 301 and one or more transition areas in the area where the circuit board 300 transitions from the one or more rigid sections 301 to the one or more flexible sections 303. In some embodiments, the one or more flexible sections 303 comprise a flexible and/or a stretchable section.

As described above, the circuit board 300 is able to comprise one or more additional mechanical strengtheners 307, such as woven glass material. Multiple mechanically restrictive components 307 can be applied, each being the same type or a different type, for example film of woven glass material impregnated with an adhesive material.

Figure 4:
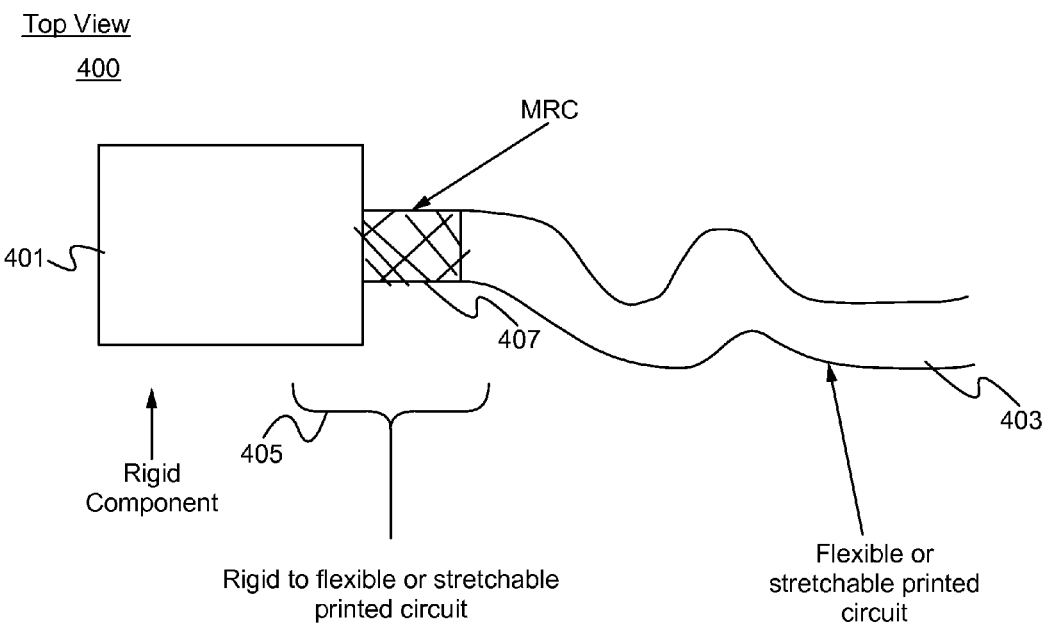
FIG. 4 illustrates a top view of a circuit board in accordance with some embodiments.

FIG. 4 illustrates a top view of a circuit board in accordance to some embodiments. The circuit board 400 is similar to the circuit boards as described above. The circuit board 400 comprises one or more rigid sections 401, one or more flexible sections 403 coupled to the rigid sections 401 and one or more transition areas in the area where the circuit board 400 transitions from the one or more rigid sections 401 to the one or more flexible sections 403. In some embodiments, the one or more flexible sections 403 comprise a flexible and/or a stretchable section. FIG. 4 shows a top view of the mechanically restrictive component 407 applied as an underlay.

As described above, the circuit board 400 is able to comprise one or more additional mechanical strengtheners 407, such as woven glass material. Multiple mechanically restrictive components 407 can be applied, each being the same type or a different type, for example film of woven glass material impregnated with an adhesive material.

Figure 5:
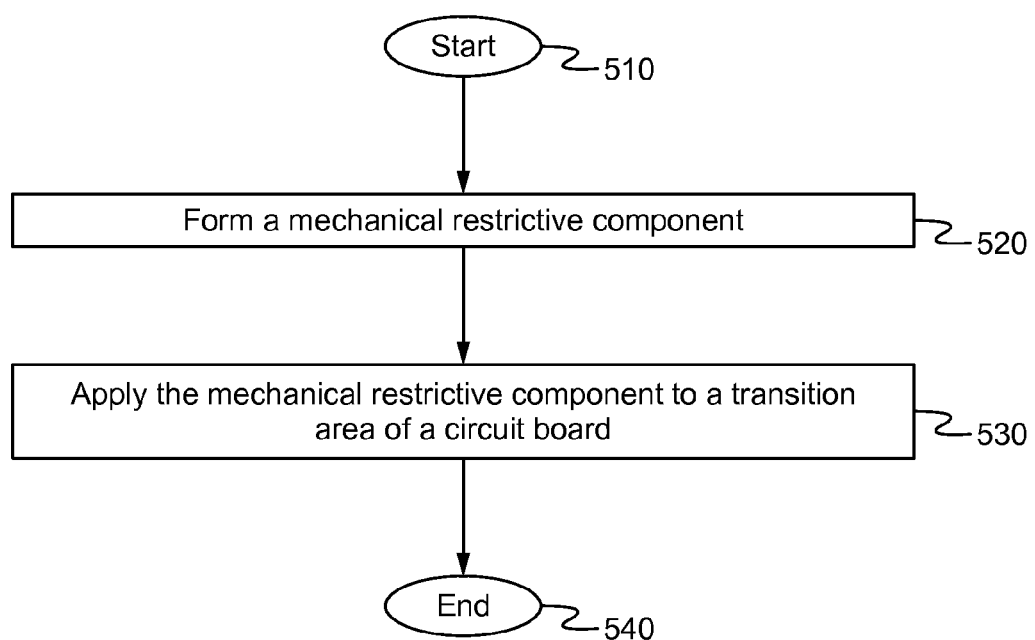
FIG. 5 illustrates a method of strengthening a flexible circuit board in accordance with some embodiments.

FIG. 5 illustrates a method of strengthening a circuit board in accordance with some embodiments. The circuit board can comprise a flexible and/or deformable electronic. The method begins in the step 510. In the step 520, a mechanically restrictive component is formed. As described above, in some embodiments, the mechanically restrictive component comprises a film. For example, in some embodiments, the mechanically restrictive component comprises a film with a thickness approximately between 0.01 mils and 20 mils. Then, in the step 530 one or more mechanically restrictive components are applied to a transition area of the circuit board and in an area where the circuit board transitions from a rigid section to a flexible section. In some embodiments, the circuit board is able to comprise one or more additional mechanical strengtheners, such as woven glass material. Multiple mechanically restrictive components can be applied, each being the same type or of different types, for example film of woven glass material impregnated with an adhesive material Each mechanically restrictive component can be applied to any layer of the printed circuit board as on overlay or underlay. In some embodiments, the one or more mechanically restrictive components are symmetrically positioned as and overlay and an underlay. The mechanical restrictive component can fill a z-axis gap if it exists between the one or more rigid sections to the one or more flexible and/or stretchable sections of the circuit board.

The mechanical restrictive component material can be an organic or semi-organic polymer (such as a silicone, rubber, PDMS, epoxy, acrylate, polyurethane or other organic polymeric material) that can be combined with a glass or organic woven cloth, organic, semi-organic or metallic particles which have a dissimilar moduli and elongation than the organic or semi organic base and which adds rigidity to the organic or semi-organic base. The mechanical restriction component can be a film that ranges in thickness from 0.01 mils to 20 mils. The width and length of the mechanical restrictive component is dependent upon the design of the rigid to flexible or stretchable printed circuit, but, the width is equivalent to at most the width of the flexible or stretchable printed circuit.

As described above, in some embodiments, the mechanical restriction component length spans from the outer surface of the rigid component to a distance of 0.001 mil or more on the flexible or stretchable printed circuit. Particularly, mechanical restriction component adheres to the rigid and flexible or stretchable printed circuit and is continuous across the rigid to flexible transition area. The mechanical restriction component material fills the z-axis gap if it exists, between the rigid to flexible or stretchable printed circuit. In some embodiments, the mechanical restriction component material is symmetrically positioned onto and/or within the printed circuit board, such as an overlay and an underlay. In other embodiments, the mechanical restriction component material is positioned as an overlay or an underlay.

In operation, one or more mechanically restrictive components are formed and applied to one or more transition areas of a circuit board. The one or more mechanically restrictive components are applied to an area where a rigid section of the flexible circuit board transitions to a flexible and/or stretchable sections of the flexible circuit board. The mechanically restrictive component protects the interconnects within the flexible and/or stretchable circuit from electrical failure. Specifically, the mechanically restrictive component reduces stress imposed failure in the form of a tear, bend, pull, flexure, compression or a combination thereof. The mechanically restrictive component protects the electrical continuity of the circuit and lessens the chance that the electrical connections will sever and/or the circuit will electrically fail. Accordingly, the circuit and method utilizing one or more mechanically restrictive components as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention. Specifically it will be apparent to someone of ordinary skill in the art that the invention is able to be used to strengthen any deformable electronic.

What is claimed is:

1. A circuit board comprising:
one or more rigid sections including a first thickness;
one or more flexible sections including a second thickness different from the first thickness and coupled to the one or more rigid sections;
one or more transition areas forming a step where the circuit board transitions from the rigid section to the flexible section; and
a plurality of mechanical restrictive components applied to the one or more transition areas, wherein each of the plurality of mechanical restrictive components is a film of woven glass material impregnated with an adhesive material, wherein at least one of the plurality of mechanical restrictive components fills the step, is on an outermost surface covering at least a portion of the one or more rigid sections, and is on an outermost surface covering at least a portion of the one or more flexible sections, wherein at least two of the plurality of mechanical restrictive components are symmetrically positioned such that a first of the at least two of the plurality of mechanical restrictive components is positioned as an overlay and a second of the at least two of the plurality of mechanical restrictive components is positioned as an underlay.

2. The circuit board of claim 1, wherein the one or more flexible sections comprise a flexible circuit board.

3. The circuit board of claim 1, wherein the one or more flexible sections comprise a stretchable circuit board.

4. The circuit board of claim 1, wherein the film comprise a thickness between 0.01 mils and 20 mils.

5. The circuit board of claim 1, further comprising one or more glass woven sections.

6. The circuit board of claim 1, wherein at least one of the plurality of mechanical restrictive components is continuous across the one or more transition areas.

7. A method of strengthening a circuit board comprising: forming a first mechanical restrictive component and a second mechanical restrictive component, wherein each of the mechanical restrictive components is a film of woven glass material impregnated with an adhesive material; obtaining a circuit board that includes a rigid section having a first level, a flexible section having a second level that is different from the first level, and a step defined by the first level and the second level; applying the first mechanical restrictive component to a transition area of the circuit board where the circuit board transitions from the rigid section to the flexible section, wherein the first mechanical restrictive component fills the step, is on an outermost surface covering at least a portion of the rigid section, and is on an outermost surface covering at least a portion of the flexible section; and applying the second mechanical restrictive component to the circuit board such that the first and second mechanical restrictive components are symmetrically positioned, wherein one of the mechanical restrictive components is positioned as an overlay and the other of the mechanical restrictive components is positioned as an underlay.

8. The method of claim 7, wherein the circuit board comprises one or more glass woven sections.

9. The method of claim 7, wherein the first mechanical restrictive component is continuous across the transition area of the circuit board.

10. The method of claim 7, wherein the flexible section comprises a flexible circuit board.

11. The method of claim 7, wherein the flexible section comprises a stretchable circuit board.

12. The method of claim 7, wherein the film comprise a thickness between 0.01 mils and 20 mils.

13. A circuit board comprising: a rigid section having a first thickness; a flexible section having a second thickness different from the first thickness, and coupling with the rigid section; a transition area including a plurality of steps where the circuit board transitions from the rigid section to the flexible section; and a plurality of mechanical restrictive components is symmetrically applied to the transition area of the circuit board, wherein each of the plurality of mechanical restrictive components is a film of woven glass material impregnated with an adhesive material wherein the plurality of mechanical restrictive components is on an outermost surface covering at least a portion of the rigid section, is on an outermost surface covering at least a portion of the flexible section, and fills the plurality of steps, wherein a first of the plurality of mechanical restrictive components is applied as an overlay and a second of the plurality of mechanical restrictive components is applied as an underlay.

14. The circuit board of claim 13, wherein the flexible section comprises a flexible circuit board.

15. The circuit board of claim 13, wherein the flexible section comprises a stretchable circuit board.

16. The circuit board of claim 13, wherein the film comprise a thickness between 0.01 mils and 20 mils.

17. The circuit board of claim 13, wherein the plurality of mechanical restrictive components is continuous across the transition area of the circuit board.

18. The circuit board of claim 13, further comprising one or more glass woven sections.

* * * * *